United States Patent
Han et al.

(10) Patent No.: US 9,263,372 B2
(45) Date of Patent: Feb. 16, 2016

(54) ANISOTROPIC CONDUCTIVE FILM AND SEMICONDUCTOR DEVICE

(71) Applicants: Jae Sun Han, Uiwang-si (KR); Hyun Wook Kim, Uiwang-si (KR); Hyun Hee Namkung, Uiwang-si (KR); Jin Young Seo, Uiwang-si (KR); Kwang Jin Jung, Uiwang-si (KR); Dong Seon Uh, Uiwang-si (KR)

(72) Inventors: Jae Sun Han, Uiwang-si (KR); Hyun Wook Kim, Uiwang-si (KR); Hyun Hee Namkung, Uiwang-si (KR); Jin Young Seo, Uiwang-si (KR); Kwang Jin Jung, Uiwang-si (KR); Dong Seon Uh, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 463 days.

(21) Appl. No.: 13/721,407

(22) Filed: Dec. 20, 2012

(65) Prior Publication Data
US 2013/0161838 A1  Jun. 27, 2013

(30) Foreign Application Priority Data

Dec. 23, 2011  (KR) .......................... 10-2011-0140906

(51) Int. Cl.
  *B32B 27/00*   (2006.01)
  *H01L 23/482*  (2006.01)
  *H01L 23/00*   (2006.01)
  *C09J 7/00*    (2006.01)
  *C09J 9/02*    (2006.01)

(52) U.S. Cl.
  CPC .............. *H01L 23/4828* (2013.01); *C09J 7/00* (2013.01); *C09J 9/02* (2013.01); *H01L 24/29* (2013.01); *C09J 2201/602* (2013.01); *C09J 2201/61* (2013.01); *C09J 2433/00* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/29393* (2013.01); *H01L 2224/29439* (2013.01); *H01L 2224/29444* (2013.01); *H01L 2224/29455* (2013.01); *H01L 2224/32225* (2013.01); *H01L 2924/07811* (2013.01); *H01L 2924/15788* (2013.01)

(58) Field of Classification Search
None
See application file for complete search history.

(56) References Cited

U.S. PATENT DOCUMENTS

2012/0255766 A1*  10/2012  Igarashi ........................ 174/257

FOREIGN PATENT DOCUMENTS

| JP | 4265140 B2 | 2/2009 |
|---|---|---|
| KR | 10-2006-0076561 A | 7/2006 |
| KR | 10-2009-0037969 A | 4/2009 |
| KR | 10-0894401 B1 | 4/2009 |
| WO | WO 2011/158666 | * 12/2011 |

OTHER PUBLICATIONS

Office Action mailed Apr. 21, 2014 in corresponding Korean Patent Application No. 10-2011-0140906.

* cited by examiner

*Primary Examiner* — Sheeba Ahmed
(74) *Attorney, Agent, or Firm* — Lee & Morse, P.C.

(57) ABSTRACT

A semiconductor device bonded by an anisotropic conductive film, the anisotropic conductive film including a phenoxy resin including a fluorene-substituted phenoxy resin; and a radically polymerizable resin including a fluorene-substituted acrylate.

6 Claims, No Drawings

ANISOTROPIC CONDUCTIVE FILM AND SEMICONDUCTOR DEVICE

CROSS-REFERENCE TO RELATED APPLICATION

Korean Patent Application No. 10-2011-0140906, filed on Dec. 23, 2011, in the Korean Intellectual Property Office, and entitled: "Anisotropic Conductive Film and Semiconductor Device," is incorporated by reference herein in its entirety.

FIELD

Embodiments relate to an anisotropic conductive film and a semiconductor device.

DESCRIPTION OF THE RELATED ART

Different types of connection methods based on the use of anisotropic conductive films in the connection between electronic components or semiconductor devices and terminals of substrates have been considered. Such anisotropic conductive connection methods may be used for, e.g., the connection between tape carrier package (TCP) terminals and transparent electrodes of glass substrates, the connection between drive I/Cs and flexible printed circuit (FPC) board terminals, and the connection between drive I/Cs and transparent electrodes in the production of panels of flat panel displays. For example, anisotropic conductive connections may be promising future packaging methods that have the potential to replace solder ball connections in flip-chip packaging, and their application range is increasingly extended.

SUMMARY

Embodiments are directed to an anisotropic conductive film and a semiconductor device.

The embodiments may be realized by providing a semiconductor device bonded by an anisotropic conductive film, the anisotropic conductive film including a phenoxy resin including a fluorene-substituted phenoxy resin; and a radically polymerizable resin including a fluorene-substituted acrylate.

The anisotropic conductive film may include about 20 to about 60 parts by weight of the phenoxy resin including the fluorene-substituted phenoxy resin, based on 100 parts by weight of a solid content of the anisotropic conductive film, and about 40 to about 80 parts by weight of the radically polymerizable resin including the fluorene-substituted acrylate, based on 100 parts by weight of the solid content of the anisotropic conductive film.

The anisotropic conductive film may include about 5 to about 50 parts by weight of the fluorene-substituted phenoxy resin, based on 100 parts by weight of the solid content of the anisotropic conductive film and about 5 to about 40 parts by weight of the fluorene-substituted acrylate, based on 100 parts by weight of the solid content of the anisotropic conductive film.

The anisotropic conductive film may further include an acrylic-modified epoxy resin.

The anisotropic conductive film may further include a urethane acrylate.

The anisotropic conductive film may have an adhesive strength of about 700 gf/cm or more, as measured after pressing at 160° C. and 3 MPa for 5 seconds.

The anisotropic conductive film may have a tensile strength of about 60 to about 200 gf/mm$^2$.

The embodiments may also be realized by providing a semiconductor device bonded by an anisotropic conductive film, the anisotropic conductive film including a phenoxy resin and a radically polymerizable resin, wherein the anisotropic conductive film exhibits an adhesive strength of about 700 gf/cm or more, as measured after pressing at 160° C. and 3 MPa for 5 seconds, and a storage modulus of about 1,000 MPa or more at a degree of cure of 90% or more.

The phenoxy resin may include a fluorene-substituted phenoxy resin.

The anisotropic conductive film may include about 5 to about 50 parts by weight of the fluorene-substituted phenoxy resin, based on 100 parts by weight of a solid content of the anisotropic conductive film.

The radically polymerizable resin may include a fluorene-substituted acrylate.

The anisotropic conductive film may include about 5 to about 40 parts by weight of the fluorene-substituted acrylate, based on 100 parts by weight of a solid content of the anisotropic conductive film.

The anisotropic conductive film may further include an acrylic-modified epoxy resin.

The anisotropic conductive film may further include a urethane acrylate.

The anisotropic conductive film may have a tensile strength of about 60 to about 200 gf/mm$^2$.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present.

Herein, the indefinite articles "a", "an" and derivation thereof do not exclude a plurality.

According to an embodiment, a semiconductor device may be bonded by an anisotropic conductive film. The anisotropic conductive film may include, e.g., a phenoxy resin including a fluorene-substituted phenoxy resin and a radically polymerizable resin including a fluorene-substituted acrylate.

a) Phenoxy Resin

The phenoxy resin may include a fluorene-substituted phenoxy resin. The fluorene-substituted phenoxy resin may include a suitable phenoxy resin that is substituted with fluorene.

In an implementation, the phenoxy resin may include a suitable phenoxy resin, together with the fluorene-substituted phenoxy resin. Examples of suitable phenoxy resins may include bisphenol A type phenoxy resins.

b) Radically Polymerizable Resin

The radically polymerizable resin may include a fluorene-substituted acrylate. The fluorene-substituted acrylate may include a suitable acrylate that is substituted with fluorene.

Examples of suitable fluorene-substituted acrylates may include fluorene-substituted epoxy (meth)acrylates and fluorene-substituted urethane (meth)acrylates.

In an implementation, the radically polymerizable resin may include a suitable radically polymerizable resin, together with the fluorene-substituted acrylate. Examples of suitable radically polymerizable resins may include acrylates, methacrylates, and maleimide compounds. For example, a monomer, an oligomer, or a combination thereof may also be used.

Acrylates and Methacrylates

Examples of suitable acrylates and methacrylates may include methyl acrylate, ethyl acrylate, isopropyl acrylate, isobutyl acrylate, ethylene glycol diacrylate, diethylene glycol diacrylate, trimethylol propane triacrylate, pentaerythritol triacrylate, tetramethylol methane tetraacrylate, 2-hydroxy-1,3-diacryloxypropane, 2,2-bis[4-(acryloxypolymethoxy) phenyl]propane, 2,2-bis[4-(acryloxypolyethoxy)phenyl] propane, dicyclopentenyl acrylate, tricyclodecanyl acrylate, and tris(acryloyloxyethyl) isocyanurate. These acrylates and methacrylates may be used alone or as a mixture of two or more thereof.

In an implementation, an acrylate or a methacrylate having a phosphoric acid ester structure, an isocyanurate-based acrylate, or a bisphenol A type epoxy acrylate resin may also be used to help improve adhesive strength and room-temperature stability of the anisotropic conductive film.

Maleimides

In an implementation, the maleimide compounds may contain at least two maleimide groups. Examples of such maleimide compounds may include 1-methyl-2,4-bismaleimidebenzene, N,N'-m-phenylenebismaleimide, N,N'-p-phenylenebismaleimide, N,N'-m-toylenebismaleimide, N,N'-4,4-biphenylenebismaleimide, N,N'-4,4-(3,3'-dimethylbiphenylene)bismaleimide, N,N'-4,4-(3,3'-dimethyldiphenylmethane)bismaleimide, N,N'-4,4-(3,3'-diethyl diphenylmethane)bismaleimide, N,N'-4,4-diphenylmethanebismaleimide, N,N'-4,4-diphenylpropanebismaleimide, N,N'-4,4-diphenyl ether bismaleimide, N,N'-3,3'-diphenylsulfonebismaleimide, 2,2-bis(4-(4-maleimidephenoxy)phenyl) propane, 2,2-bis(3-s-butyl-4-s-(4-maleimidephenoxy)phenyl)propane, 1,1-bis(4-(4-maleimidephenoxy)phenyl)decane, 4,4'-cyclohexylidene bis(1-(4-maleimidephenoxy)-2-cyclohexylbenzene, and 2,2-bis(4-(4-maleimidephenoxy)phenyl)hexafluoropropane. These maleimide compounds may be used alone or as a mixture of two or more thereof.

The phenoxy resin may be included in the anisotropic conductive film in an amount of about 20 to about 60 parts by weight, based on 100 parts by weight of a solid content of the anisotropic conductive film.

The fluorene-substituted phenoxy resin may be included in the anisotropic conductive film in an amount of about 5 to about 50 parts by weight, based on 100 parts by weight of the solid content of the anisotropic conductive film. Within this range, high reliability may be obtained.

The radically polymerizable resin may be included in the anisotropic conductive film in an amount of about 40 to about 80 parts by weight, based on 100 parts by weight of the solid content of the anisotropic conductive film.

The fluorene-substituted acrylate may be included in the anisotropic conductive film in an amount of about 5 to about 40 parts by weight, based on 100 parts by weight of the solid content of the anisotropic conductive film. Within this range, sufficient low-temperature rapid curability may be obtained.

In an implementation, the anisotropic conductive film may further include a curing initiator and/or conductive particles.

Curing Initiator

The curing initiator may include a suitable curing initiator, e.g., peroxide and/or azo initiators. Examples of suitable peroxide initiators may include benzoyl peroxide, lauryl peroxide, t-butylperoxylaurate, 1,1,3,3-tetramethylbutyl peroxy-2-ethylhexanoate and cumene hydroperoxide. Examples of suitable azo initiators may include 2,2'-azobis(4-methoxy-2,4-dimethylvaleronitrile), dimethyl 2,2'-azobis(2-methylpropionate) and 2,2'-azobis(N-cyclohexyl-2-methyl propionate).

Conductive Particles

The conductive particles may include suitable conductive particles, e.g., metal particles, such as Au, Ag, Ni, Cu, and solder particles; carbon particles; particles of resins such as polyethylene, polypropylene, polyester, polystyrene, polyvinyl alcohol and modified resins thereof plated and coated with metals such as Au, Ag, and Ni; and insulated conductive particles obtained by further coating insulating particles on the metal-coated polymer resin particles.

A particle diameter of the conductive particles may be determined depending on a pitch of circuits to be applied. In an implementation, the particle diameter of the conductive particles may be about 2 to about 30 μm, according to an intended or desired application.

The conductive particles may be included in the anisotropic conductive film in an amount of about 0.1 to about 10 parts by weight, based on 100 parts by weight of the solid content of the anisotropic conductive film. Maintaining the amount of the conductive particles at about 0.1 parts by weight or greater may help reduce and/or prevent misalignment between terminals in the course of connection, thereby ensuring sufficient connection area of the terminals thereby ensuring a good connection. Maintaining the amount of the conductive particles at about 10 parts by weight or less may help prevent poor insulation properties.

In an implementation, the anisotropic conductive film may further include an epoxy or phenoxy resin. Examples of suitable epoxy and phenoxy resins may include novolac type epoxy resins, epihalohydrin-modified epoxy resins, acrylic-modified epoxy resins, vinyl-modified epoxy resins, epihalohydrin-modified phenoxy resins, acrylic-modified phenoxy resins, and vinyl-modified phenoxy resins.

The epihalohydrin-modified epoxy resins may be prepared by reacting an epoxy resin containing hydroxyl groups in the molecule with an epihalohydrin. The acrylic-modified epoxy resins may be prepared by reacting an epoxy resin containing hydroxyl groups in the molecule with an acrylic monomer. The vinyl-modified epoxy resins may be prepared by reacting an epoxy resin containing hydroxyl groups in the molecule with a vinyl monomer.

In an implementation, the epoxy resins may include epoxy resins modified with a rubber resin in the epoxy molecule. For example, the rubber resin for the modification of the epoxy resins may be selected from the group of butadiene polymers, acrylic polymers, polyether urethane rubbers, polyester urethane rubbers, polyamide urethane rubbers, silicone rubbers, dimer acids, silicone resins, and mixtures thereof.

These epoxy and phenoxy resins may be used alone or as a mixture of two or more thereof.

Examples of epoxy resins that may be modified with the rubber resin may include bisphenol A type resins, bisphenol F type resins, bisphenol AD type resins, bisphenol S type resins, alkylene oxide adducts, halides (e.g., tetrabromobisphenol type epoxy resins), and hydrogenation products (e.g., hydrogenated bisphenol type epoxy resins) thereof; and alicyclic epoxy resins, alicyclic chain epoxy resins, and halides and hydrogenation products thereof.

Examples of commercially available products for the modified epoxy resins may include KD-1011, KD-1012 and KD-1014, all of which are available from Kukdo Chemical Co., Ltd.; and EP-5100R, EP-5200R, and EP-5400R, all of which are available from ADEKA.

The epoxy or phenoxy resin may be included in the anisotropic conductive film in an amount of up to about 40 parts by weight, e.g., about 10 to about 40 parts by weight, based on 100 parts by weight of the solid content of the anisotropic conductive film. Within this range, further improved miscibility between the fluorene-substituted phenoxy resin and the fluorene-substituted acrylate may be ensured, and high adhesiveness and reliability of the anisotropic conductive film may be obtained.

In an implementation, the anisotropic conductive film may further include a urethane acrylate. The urethane acrylate may be prepared by polymerization of an isocyanate, an acrylate, a polyol, and/or a diol.

The isocyanate may include, e.g., an aromatic diisocyanate, an aliphatic diisocyanate, an alicyclic diisocyanate, or a combination thereof. For example, the isocyanate may be selected from the group of isophorone diisocyanate (IPDI), tetramethylene-1,4-diisocyanate, hexamethylene-1,6-diisocyanate, diphenylmethane diisocyanate, cyclohexylene-1,4-diisocyanate, methylenebis(4-cyclohexyl isocyanate), xylene diisocyanate, hydrogenated diphenylmethane diisocyanate, naphthalene diisocyanate, 2,4-toluene diisocyanate, 2,6-toluene diisocyanate, and mixtures thereof. In an implementation, the isocyanate may include an aromatic isocyanate.

The acrylate may include, e.g., a hydroxy acrylate and/or an amine acrylate.

The polyol or diol may include, e.g., ethylene glycol, propylene glycol, hexanediol, neopentyl glycol, diethylene glycol, triethylene glycol, 1,3-propanediol, 1,3-butanediol, 1,4-butanediol, 1,5-pentanediol, 1,6-hexanediol, dipropylene glycol, dibutylene glycol, 2-methyl-1,3-pentanediol, 2,2,4-trimethyl-1,3-pentanediol, and/or 1,4-cyclohexanedimethanol.

The polymerization may be performed by a suitable process, e.g., by reacting about 60 weight % of a polyol with a hydroxy (meth)acrylate and an isocyanate (molar ratio 1:1) in 50% by volume of methyl ethyl ketone as a solvent in the presence of dibutyltin dilaurylate as a catalyst at 90° C. and 1 atm for 5 hours.

In an implementation, the anisotropic conductive film may have a tensile strength of about 60 to about 200 gf/mm$^2$, e.g., about 100 to about 200 gf/mm$^2$. Within this range, the film may be peeled without being cut when rework is performed after preliminary pressing.

The tensile strength may be measured by a suitable method. For example, after the anisotropic conductive film is cut into a sample having a size of about 1.0 mm (width)×about 10 mm (length), the tensile strength of the sample may be measured using a universal testing machine (UTM) (H5K-T, Hounsfield).

The embodiments provide a semiconductor device bonded by an anisotropic conductive film, the anisotropic conductive film including a phenoxy resin and a radically polymerizable resin. The anisotropic conductive film may have an adhesive strength of about 700 gf/cm or more, as measured after pressing at 160° C. and 3 MPa for 5 seconds. The anisotropic conductive film may have a storage modulus of about 1,000 MPa or more at a degree of cure of 90% or more.

The adhesive strength may be measured by a suitable method. For example, after the anisotropic conductive film is pressed at 160° C. and 3 MPa for 5 seconds, the peel strength may be measured at a peeling angle of 90° and a peeling speed of 50 mm/min using a peel strength tester (H5KT, Tinius Olsen).

As described above, the adhesive strength of the anisotropic conductive film may be about 700 gf/cm or more. Maintaining the adhesive strength at about 700 gf/cm or more may facilitate using a semiconductor device (including the anisotropic conductive film as a connection material) for a long period of time, i.e., ensuring a sufficient lifespan of the semiconductor device.

The storage modulus of the anisotropic conductive film may be defined as a value measured at a degree of cure of 90% or more. The degree of cure of 90% or more may indicate a time when the anisotropic conductive film is substantially completely cured.

The storage modulus may be measured by a suitable method. For example, after sheets of the anisotropic conductive film are laminated together until a total thickness reaches 100 μm and are allowed to stand in a hot-air oven at 150° C. for 2 hours, the storage modulus of the laminate may be measured using a dynamic mechanical analyzer (DMA) (Q800, TA).

As described above, the storage modulus of the anisotropic conductive film may be about 1,000 MPa or more. Maintaining the storage modulus at about 1,000 MPa or more may help ensure that thermal shrinkage and expansion are effectively controlled, thereby ensuring sufficient reliability.

The anisotropic conductive film may be formed by a suitable method. For example, the anisotropic conductive film may be obtained by dissolving the binder resins in an organic solvent, adding other components to the solution, stirring the mixture for a certain amount of time, applying the mixture to an appropriate thickness (e.g., about 10 to about 50 μm) onto a release film, and drying the mixture for a time sufficient to vaporize the organic solvent.

The embodiments provide a semiconductor device. The semiconductor device may include a wiring substrate, an anisotropic conductive film attached to a surface of the wiring substrate, and semiconductor chips mounted on the film.

The wiring substrate and the semiconductor chips may include a suitable wiring substrate and the semiconductor chips. The semiconductor device may be fabricated by a suitable method.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

EXAMPLES

Example 1

Production of Anisotropic Conductive Film Containing Fluorene-Substituted Phenoxy Resin and Fluorene-Substituted Acrylate Based on 100 parts by weight of the solid content of an anisotropic conductive film to be produced, 1) 47 parts by weight of a fluorene-substituted phenoxy resin (FX293, New Japan Chemical), 2) 35 parts by weight of a fluorene-substituted acrylate (BPF-022, Hannong Chemicals Inc.),
3) 5 parts by weight of conductive particles (NIEYB00375, Sekisui),
4) 3 parts by weight of an adhesion aid (KBM-403, Shinetsu), and
5) 10 parts by weight of a capsule type imidazole curing agent (HXA-3941, Asahi Kasei) were used to prepare an anisotropic conductive film composition.

The composition was stirred at room temperature (~25° C.) at a rate that did not cause pulverization of the conductive particles. The obtained solution was thinly applied to a polyethylene terephthalate (PET) base film surface treated with a silicone release agent and dried using hot air at 70° C. for 5 min to form a 30 µm thick film. A casting knife was used for the film formation.

Example 2

Production of Anisotropic Conductive Film Containing Fluorene-Substituted Phenoxy Resin, Fluorene-Substituted Acrylate and Epoxy Resin An anisotropic conductive film was produced in the same manner as in Example 1, except that the fluorene-substituted phenoxy resin was used in an amount of 32 parts by weight, the fluorene-substituted acrylate was used in an amount of 25 parts by weight, and an epoxy resin (SG-80H, Nagase) was used in an amount of 25 parts by weight.

Example 3

Production of Anisotropic Conductive Film Containing Fluorene-Substituted Phenoxy Resin, Fluorene-Substituted Acrylate, Epoxy Resin and Urethane Acrylate Based on 100 parts by weight of the solid content of an anisotropic conductive film to be produced,
1) 20 parts by weight of a fluorene-substituted phenoxy resin,
2) 10 parts by weight of a fluorene-substituted acrylate,
3) 20 parts by weight of an epoxy resin (SG-80H, Nagase),
4) 10 parts by weight of a urethane acrylate,
5) 12 parts by weight of a radically polymerizable resin (80MFA, Kyoeisha Chemical Co., Ltd.),
6) 5 parts by weight of conductive particles (NIEYB00375, Sekisui),
7) 3 parts by weight of an adhesion aid (KBM403, Shinetsu), and
8) 10 parts by weight of a peroxide initiator (BPO/LPO, Dongsung Highchem) were used to prepare an anisotropic conductive film composition.

An anisotropic conductive film was formed using the composition by the same procedure as described in Example 1.

Comparative Examples 1-4

Production of Anisotropic Conductive Films Containing No Fluorene-Substituted Phenoxy Resin and Fluorene-Substituted Acrylate Comparative Example 1

An anisotropic conductive film was produced in the same manner as in Example 1, except that none of the fluorene-substituted phenoxy resin and the fluorene-substituted acrylate were used, and a BPA phenoxy resin (PKHH, Union Carbide) and an epoxy resin (SG-80H, Nagase) were used in 37 parts by weight and 45 parts by weight, respectively.

Comparative Example 2

An anisotropic conductive film was produced in the same manner as in Example 3, except that none of the fluorene-substituted phenoxy resin and the fluorene-substituted acrylate were used, and the urethane acrylate and the radically polymerizable resin were used in amounts of 45 parts by weight and 37 parts by weight, respectively.

Comparative Example 3

An anisotropic conductive film was produced in the same manner as in Comparative Example 1, except that 32 parts by weight of the BPA phenoxy resin, 25 parts by weight of the epoxy resin and 25 parts by weight of a radically polymerizable resin (80MFA, Kyoeisha Chemical Co., Ltd.) were used.

Comparative Example 4

An anisotropic conductive film was produced in the same manner as in Comparative Example 2, except that 25 parts by weight of the urethane acrylate, 25 parts by weight of the radically polymerizable resin and 32 parts by weight of a BPA phenoxy resin (PKHH, Union Carbide) were used.

Comparative Example 5

Production of Anisotropic Conductive Film Containing Fluorene-Substituted Phenoxy Resin but Containing No Fluorene-Substituted Acrylate An anisotropic conductive film was produced in the same manner as in Comparative Example 4, except that a fluorene-substituted phenoxy resin was used instead of the BPA phenoxy resin.

In Tables 1 and 2, below, contents of the components of the anisotropic conductive film compositions prepared in Examples 1-3 and Comparative Examples 1-5 are shown in terms of parts by weight.

TABLE 1

| Component | Example 1 | Example 2 | Example 3 |
|---|---|---|---|
| BPA phenoxy resin | — | — | — |
| Fluorene-substituted phenoxy resin | 47 | 32 | 20 |
| Radically polymerizable resin | — | — | 12 |
| Urethane acrylate | — | — | 10 |
| Fluorene-substituted acrylate | 35 | 25 | 10 |
| Epoxy resin | — | 25 | 20 |
| Conductive particles | 5 | 5 | 5 |
| Adhesion aid | 3 | 3 | 3 |
| Peroxide initiator | — | — | 10 |
| Capsule type imidazole curing agent | 10 | 10 | — |
| Total | 100 | 100 | 100 |

TABLE 2

| Component | Comparative Example 1 | Comparative Example 2 | Comparative Example 3 | Comparative Example 4 | Comparative Example 5 |
|---|---|---|---|---|---|
| BPA phenoxy resin | 37 | — | 32 | 32 | — |
| Fluorene-substituted phenoxy resin | — | — | — | — | 32 |
| Radically polymerizable resin | — | 37 | 25 | 25 | 25 |
| Urethane acrylate | — | 45 | — | 25 | 25 |
| Fluorene-substituted acrylate | — | — | — | — | — |
| Epoxy resin | 45 | — | 25 | — | — |
| Conductive particles | 5 | 5 | 5 | 5 | 5 |
| Adhesion aid | 3 | 3 | 3 | 3 | 3 |
| Peroxide initiator | — | 10 | — | 10 | 10 |
| Capsule type imidazole curing agent | 10 | — | 10 | — | — |
| Total | 100 | 100 | 100 | 100 | 100 |

Experimental Example 1

Evaluation of Miscibility Between Phenoxy Resins and Acrylates

Each of the anisotropic conductive film compositions prepared in Examples 1-3 and Comparative Examples 1-5 was stirred in a paste mixer, allowed to stand at 25° C. for 1 hr, and applied onto a polyethylene terephthalate (PET) film having a release layer formed thereon. Uniformity of the film formed on the release layer was observed with naked eyes.

The miscibility was evaluated to be 'excellent' when the film was very uniform, 'good' when the film had average uniformity, and 'poor' when the film was not uniform.

Experimental Example 2

Tensile Strength Measurement

Each of the anisotropic conductive films produced in Examples 1-3 and Comparative Examples 1-5 was cut into a sample having a size of 1.0 mm (width)×10 mm (length). The tensile strength of the sample was measured using a universal testing machine (UTM) (H5K-T, Hounsfield).

Experimental Example 3

Storage Modulus Measurement After Curing

Sheets of each of the anisotropic conductive films produced in Examples 1-3 and Comparative Examples 1-5 were laminated together until the total thickness reached 100 μm and were allowed to stand in a hot-air oven at 150° C. for 2 hr. Thereafter, the storage modulus of the laminate at 40° C. was measured using a dynamic mechanical analyzer (DMA) (Q800, TA).

Experimental Example 4

Measurements of Initial Adhesive Strength and Reliable Adhesive Strength

Each of the anisotropic conductive films of Examples 1-3 and Comparative Examples 1-5 was connected to a flexible printed circuit (FPC) having 200 copper circuits or more (line width=100 μm, pitch=100 μm, thickness=18 μm) by pressing at 160° C. and 3 MPa for 5 sec to prepare a specimen.

The initial adhesive strength of the specimen was measured at a peeling angle of 90° and a peeling speed of 50 mm/min using a peel strength tester (H5KT, Tinius Olsen).

For high temperature and high humidity reliability evaluation, the specimen was allowed to stand at a temperature of 85° C. and a relative humidity of 85% for 100 hr. Then, the reliable adhesive strength of the specimen was measured by the same manner as described above.

Experimental Example 5

Measurements of Initial Connection Resistance and Reliable Connection Resistance Each of the anisotropic conductive films of Examples 1-3 and Comparative Examples 1-5 was connected to a flexible printed circuit (FPC) having 200 copper circuits or more (line width=100 μm, pitch=100 μm, thickness=18 μm) by pressing at 160° C. and 3 MPa for 5 sec to prepare a specimen.

The initial connection resistance of the specimen was measured using a 4-probe method (ASTM F43-64T).

For high temperature and high humidity reliability evaluation, the specimen was left standing at a temperature of 85° C. and a relative humidity of 85% for 500 hr. Then, the reliable connection resistance of the specimen was measured pursuant to ASTM D117.

Tables 3 and 4, below, show measurement results in Experimental Examples 1-5.

TABLE 3

| Physical properties | Example 1 | Example 2 | Example 3 |
|---|---|---|---|
| Miscibility | Excellent | Excellent | Excellent |
| Tensile strength (gf/mm$^2$) | 150 | 140 | 150 |
| Storage modulus (MPa) | 1,200 | 1,400 | 2,000 |
| Adhesive strength (gf/cm) | 720 | 760 | 820 |
| Connection resistance (Ω) | 0.8 | 0.9 | 0.8 |
| Reliable adhesive strength (gf/cm) | 610 | 540 | 630 |
| Reliable connection resistance (Ω) | 1.1 | 1.2 | 0.9 |

TABLE 4

| Physical properties | Comparative Example 1 | Comparative Example 2 | Comparative Example 3 | Comparative Example 4 | Comparative Example 5 |
|---|---|---|---|---|---|
| Miscibility | Good | Good | Poor | Poor | Good |
| Tensile strength (gf/mm$^2$) | 120 | 90 | 40 | 46 | 120 |
| Storage modulus (MPa) | 1500 | 1200 | 800 | 600 | 800 |
| Adhesive strength (gf/cm) | 520 | 580 | Impossible to evaluate | Impossible to evaluate | 640 |
| Connection resistance (Ω) | 1.2 | 1.5 | Impossible to evaluate | Impossible to evaluate | 1.2 |
| Reliable adhesive strength (gf/cm) | 340 | 330 | Impossible to evaluate | Impossible to evaluate | 420 |
| Reliable connection resistance (Ω) | 4.4 | 5.8 | Impossible to evaluate | Impossible to evaluate | 2.0 |

From the above measurement results, it may be seen that the anisotropic conductive films produced using the fluorene-substituted phenoxy resin and the fluorene-substituted acrylate exhibited excellent miscibility, high tensile strength, and high storage modulus. In addition, the films of Examples 1-3 were effectively connected under low-temperature rapid curing conditions, demonstrating their excellent physical properties in terms of reliable adhesive strength and reliable connection resistance as well as initial adhesive strength and initial connection resistance.

The films of Comparative Examples 1, 2, and 5 exhibited good miscibility, but were not effectively connected under low-temperature rapid curing conditions, revealing their low adhesive strengths. For example, the films exhibited inferior physical properties in terms of reliable adhesive strength and reliable connection resistance. From these results, it may be seen that when the films were connected to semiconductor films, it was difficult to use the semiconductor films for a long period of time while maintaining the reliability of the films.

The films of Comparative Examples 3 and 4 exhibited poor miscibility and were not substantially connected under low-temperature rapid curing conditions, revealing their very low adhesive strengths. As a result, it was impossible to evaluate the adhesive strengths and connection resistances of the films.

Therefore, it may be seen that the combined use of the fluorene-substituted phenoxy resin and the fluorene-substituted acrylate in the production of the anisotropic conductive films achieved low-temperature rapid curability and high reliability of the films. In addition, it may be seen that the suitable addition of the epoxy resin and/or the urethane acrylate provided superior physical properties of the anisotropic conductive films.

As is apparent from the foregoing, the anisotropic conductive film according to an embodiment may be rapidly curable at low temperature and may be highly reliable due to the presence of the fluorene-substituted phenoxy resin and the fluorene-substituted acrylate.

For example, the anisotropic conductive film according to an embodiment may use the fluorene-substituted product of the anionically curable compound and the fluorene-substituted product of the radically curable compound (that is substantially immiscible with the anionically curable compound), thereby achieving miscibility of the fluorene-substituted products.

In addition, the anisotropic conductive film according to an embodiment may include the fluorene-substituted phenoxy resin and the fluorene-substituted acrylate miscible with the fluorene-substituted phenoxy resin to exhibit rapid curability at low temperature as well as high storage modulus, achieving high reliability.

By way of summation and review, when an anisotropic conductive film is used to bond drive I/Cs and transparent electrodes at high temperature, severe distortion may occur upon heat curing after bonding due to a difference in coefficient of thermal expansion between a silicon wafer constituting the drive I/Cs and glass on which the transparent electrodes are formed. Such distortion may lead to the formation of defects in final products. Thus, development of an anisotropic conductive film that undergoes curing at low temperature within a short time may be desirable.

An anisotropic conductive film may expand upon bonding under heat and pressure and may shrink after bonding. As a result of the expansion and shrinkage, bubbles may be generated and sufficient filling of an adhesive composition may be impeded, thereby leaving interstices in the film. The generation of a number of bubbles may result in poor adhesion strength of the anisotropic conductive film, making it difficult or impossible to use a semiconductor device including the anisotropic conductive film as a connection material for a long period of time. Accordingly, low reliability of the semiconductor device may occur.

A resin composition for an anisotropic conductive adhesive may use an epoxy resin whose hydroxyl groups are substituted with other functional groups and a radically polymerizable resin that is substantially immiscible with the epoxy resin before substitution. The two hardly compatible resins may become miscible with each other. However, slow low-temperature curability and low reliability may still exist.

The embodiments provide a highly reliable anisotropic conductive film that undergo rapid curing at low temperature.

The anisotropic conductive film according to an embodiment may utilize a fluorene-substituted product of an anionically curable compound and a fluorene-substituted product of a radically curable compound to achieve miscibility of the anionically curable compound and the radically curable compound.

For example, the embodiments provide an anisotropic conductive film that contains a fluorene-substituted phenoxy resin and a fluorene-substituted acrylate to achieve miscibility and rapid curability at a low temperature as well as high storage modulus, thereby achieving high reliability.

The embodiments provide an anisotropic conductive film that contains a fluorene-substituted phenoxy resin and a fluorene-substituted acrylate to achieve rapid curability at low temperature and high reliability, and a semiconductor device bonded by the film.

The embodiments provide an anisotropic conductive film that uses a fluorene-substituted product of an anionically curable compound and a fluorene-substituted product of a radically curable compound to achieve miscibility of the anionically curable compound and the radically curable compound, and a semiconductor device bonded by the film.

The embodiments provide an anisotropic conductive film that contains a fluorene-substituted phenoxy resin and a fluorene-substituted acrylate to have miscibility and rapid curability at low temperature as well as high storage modulus, achieving high reliability, and a semiconductor device bonded by the film.

The embodiments provide a semiconductor device including a wiring substrate and semiconductor chips, wherein the wiring substrate is connected to the semiconductor chips through the anisotropic conductive film. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device bonded by an anisotropic conductive film, the anisotropic conductive film including:
    a phenoxy resin including a fluorene-substituted phenoxy resin; and
    a radically polymerizable resin including a fluorene-substituted acrylate, wherein the anisotropic conductive film has:
        an adhesive strength of about 700 gf/cm or more, as measured after pressing at 160° C. and 3 MPa for 5 seconds, and
        a storage modulus of about 1,000 MPa or more at a degree of cure of 90% or more.

2. The semiconductor device as claimed in claim 1, wherein the anisotropic conductive film includes:
    about 20 to about 60 parts by weight of the phenoxy resin including the fluorene-substituted phenoxy resin, based on 100 parts by weight of a solid content of the anisotropic conductive film, and
    about 40 to about 80 parts by weight of the radically polymerizable resin including the fluorene-substituted acrylate, based on 100 parts by weight of the solid content of the anisotropic conductive film.

3. The semiconductor device as claimed in claim 1, wherein the anisotropic conductive film includes:
    about 5 to about 50 parts by weight of the fluorene-substituted phenoxy resin, based on 100 parts by weight of the solid content of the anisotropic conductive film and
    about 5 to about 40 parts by weight of the fluorene-substituted acrylate, based on 100 parts by weight of the solid content of the anisotropic conductive film.

4. The semiconductor device as claimed in claim 1, wherein the anisotropic conductive film further includes an acrylic-modified epoxy resin.

5. The semiconductor device as claimed in claim 1, wherein the anisotropic conductive film further includes a urethane acrylate.

6. The semiconductor device as claimed in claim 1, wherein the anisotropic conductive film has a tensile strength of about 60 to about 200 $gf/mm^2$.

* * * * *